(12) United States Patent
Gill

(10) Patent No.: US 7,746,603 B2
(45) Date of Patent: Jun. 29, 2010

(54) CPP MAGNETORESISTIVE HEAD WITH DIFFERENT THICKNESS FREE LAYERS FOR IMPROVED SIGNAL TO NOISE RATIO

(75) Inventor: Hardayal S. Gill, Palo Alto, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 767 days.

(21) Appl. No.: 11/612,942

(22) Filed: Dec. 19, 2006

(65) Prior Publication Data

US 2008/0144235 A1 Jun. 19, 2008

(51) Int. Cl.
G11B 5/39 (2006.01)

(52) U.S. Cl. .................................. 360/324.12

(58) Field of Classification Search .............. 360/324.1, 360/324.11, 324.12, 324.2
See application file for complete search history.

(56) References Cited

U.S. PATENT DOCUMENTS

| | | | |
|---|---|---|---|
| 6,052,263 A | 4/2000 | Gill | |
| 6,266,218 B1 | 7/2001 | Carey et al. | |
| 6,788,502 B1 | 9/2004 | Gill | |
| 2004/0061977 A1 | 4/2004 | Freitag et al. | |
| 2004/0218311 A1* | 11/2004 | Saito et al. | ........... 360/314 |
| 2004/0252416 A1 | 12/2004 | Horng et al. | |
| 2005/0024792 A1 | 2/2005 | Li et al. | |
| 2005/0141146 A1 | 6/2005 | Pinarbasi | |
| 2005/0152077 A1* | 7/2005 | Yuasa et al. | ............ 360/324.11 |
| 2005/0243479 A1* | 11/2005 | Gill | ........................ 360/324.12 |
| 2005/0280957 A1* | 12/2005 | Gill | ........................ 360/324.12 |
| 2006/0067016 A1* | 3/2006 | Childress et al. | ....... 360/324.12 |
| 2008/0043376 A1* | 2/2008 | Ohtsu et al. | ................. 360/314 |
| 2008/0158737 A1* | 7/2008 | Kamiguchi et al. | ...... 360/324.1 |

* cited by examiner

*Primary Examiner*—Jefferson Evans
(74) *Attorney, Agent, or Firm*—Patterson & Sheridan, L.L.P.

(57) ABSTRACT

A magnetoresistive sensor and method for forming the magnetoresistive sensor. The magnetoresistive sensor includes a first layer and an antiparallel free layer disposed on the first layer. The antiparallel free layer includes a first free layer disposed on the first layer and a first ferromagnetic coupling free layer disposed on the first free layer. The first ferromagnetic coupling layer is configured to provide increased coupling between the first free layer and an antiferromagnetic coupling layer. The antiparallel free layer also includes the antiferromagnetic coupling layer disposed on the first ferromagnetic coupling free layer, a second ferromagnetic coupling free layer disposed on the antiferromagnetic coupling layer, and a second free layer disposed on the second ferromagnetic coupling free layer. The second ferromagnetic coupling layer is configured to provide increased coupling between the second free layer and the antiferromagnetic coupling layer.

30 Claims, 5 Drawing Sheets

CPP MAGNETORESISTIVE HEAD WITH DIFFERENT THICKNESS FREE LAYERS FOR IMPROVED SIGNAL TO NOISE RATIO

BACKGROUND OF THE INVENTION

1. Field of the Invention

Embodiments of the present invention generally relate to magnetoresistive sensors. Specifically, embodiments of the invention relate to magnetoresistive sensors, methods for manufacturing magnetoresistive sensors, and apparatuses using magnetoresistive sensors.

2. Description of the Related Art

Modern computer systems typically include a hard drive which may be used as mass storage for the computer system. Information in the hard drive is typically stored by changing the magnetization of areas on one or more magnetic disks within the hard drive. To read the information, the hard drive typically includes a magnetoresistive sensor which senses the magnetic fields from the magnetized areas as the magnetic disks spin beneath or above the magnetoresistive sensor.

Modern magnetoresistive sensors typically include several layers of material deposited on a base layer. As the magnetoresistive sensor passes over a magnetized area of a magnetic disk, the magnetic field from the magnetized area may induce a detectable change in the layers of material in the magnetoresistive sensor. For example, during a read operation, a current may be applied to the layers of material in the magnetoresistive sensor. The current applied to the layers of material may create a voltage across the layers of material which is proportional to the resistance of the layers of material. As the sensor passes over a magnetic field of a magnetized area on the magnetic disk, the magnetic field may cause a change in the combined resistance of the layers of material (e.g., an increase or decrease in the resistance of the layers of material). The magnetic field of the magnetized area may then be measured via a corresponding change in the voltage across the layers of material (e.g., a corresponding increase or decrease in the voltage resulting from the current applied to the layers of material).

In some cases, the magnetic field within a magnetoresistive sensor may experience instability due to operating conditions (e.g., the current applied to the sensor, the temperature of the sensor, and/or previous magnetic fields applied to the sensor) in which the sensor is used. Instability in the magnetic field of the sensor may degrade read operations performed with the sensor by increasing noise in the read signals obtained from the sensor. Accordingly, to improve operation of the sensor, there may be a desire to improve the magnetic stability of a magnetoresistive sensor. However, increasing the magnetic stability of the magnetoresistive sensor may also reduce the sensitivity of the magnetoresistive sensor by reducing the ability of the magnetoresistive sensor to respond to magnetized areas of a hard drive disk.

Therefore, what is needed is a magnetoresistive sensor which provides increased magnetic stability without reduced sensitivity and a method for making the magnetoresistive sensor.

SUMMARY OF THE INVENTION

The present invention generally provides a magnetoresistive sensor and a method for forming the magnetoresistive sensor. In one embodiment, the method for forming the magnetoresistive sensor includes providing a first layer and providing an antiparallel free layer formed on the first layer. Providing the antiparallel free layer includes providing a first free layer formed on the first layer and providing a first ferromagnetic coupling free layer formed on the first free layer. The first ferromagnetic coupling layer is configured to provide increased coupling between the first free layer and an antiferromagnetic coupling layer. The method also includes providing the antiferromagnetic coupling layer formed on the first ferromagnetic coupling free layer, providing a second ferromagnetic coupling free layer formed on the antiferromagnetic coupling layer, and providing a second free layer formed on the second ferromagnetic coupling free layer. The second ferromagnetic coupling layer is configured to provide increased coupling between the second free layer and the antiferromagnetic coupling layer.

One embodiment of the invention provides a magnetoresistive sensor including a first layer and an antiparallel free layer disposed on the first layer. The antiparallel free layer includes a first free layer disposed on the first layer and a first ferromagnetic coupling free layer disposed on the first free layer. The first ferromagnetic coupling layer is configured to provide increased coupling between the first free layer and an antiferromagnetic coupling layer. The antiparallel free layer also includes the antiferromagnetic coupling layer disposed on the first ferromagnetic coupling free layer, a second ferromagnetic coupling free layer disposed on the antiferromagnetic coupling layer, and a second free layer disposed on the second ferromagnetic coupling free layer. The second ferromagnetic coupling layer is configured to provide increased coupling between the second free layer and the antiferromagnetic coupling layer.

One embodiment of the invention also provides a hard drive including one or more magnetic disks and at least one magnetoresistive sensor configured to read data from the one or magnetic disks. The magnetoresistive sensor includes a first layer and an antiparallel free layer disposed on the first layer. The antiparallel free layer includes a first free layer disposed on the first layer and a first ferromagnetic coupling free layer disposed on the first free layer. The first ferromagnetic coupling layer is configured to provide increased coupling between the first free layer and an antiferromagnetic coupling layer. The antiparallel free layer also includes the antiferromagnetic coupling layer disposed on the first ferromagnetic coupling free layer and a second ferromagnetic coupling free layer disposed on the antiferromagnetic coupling layer, and a second free layer disposed on the second ferromagnetic coupling free layer. The second ferromagnetic coupling layer is configured to provide increased coupling between the second free layer and the antiferromagnetic coupling layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

An Exemplary Hard Drive

Figure 1:
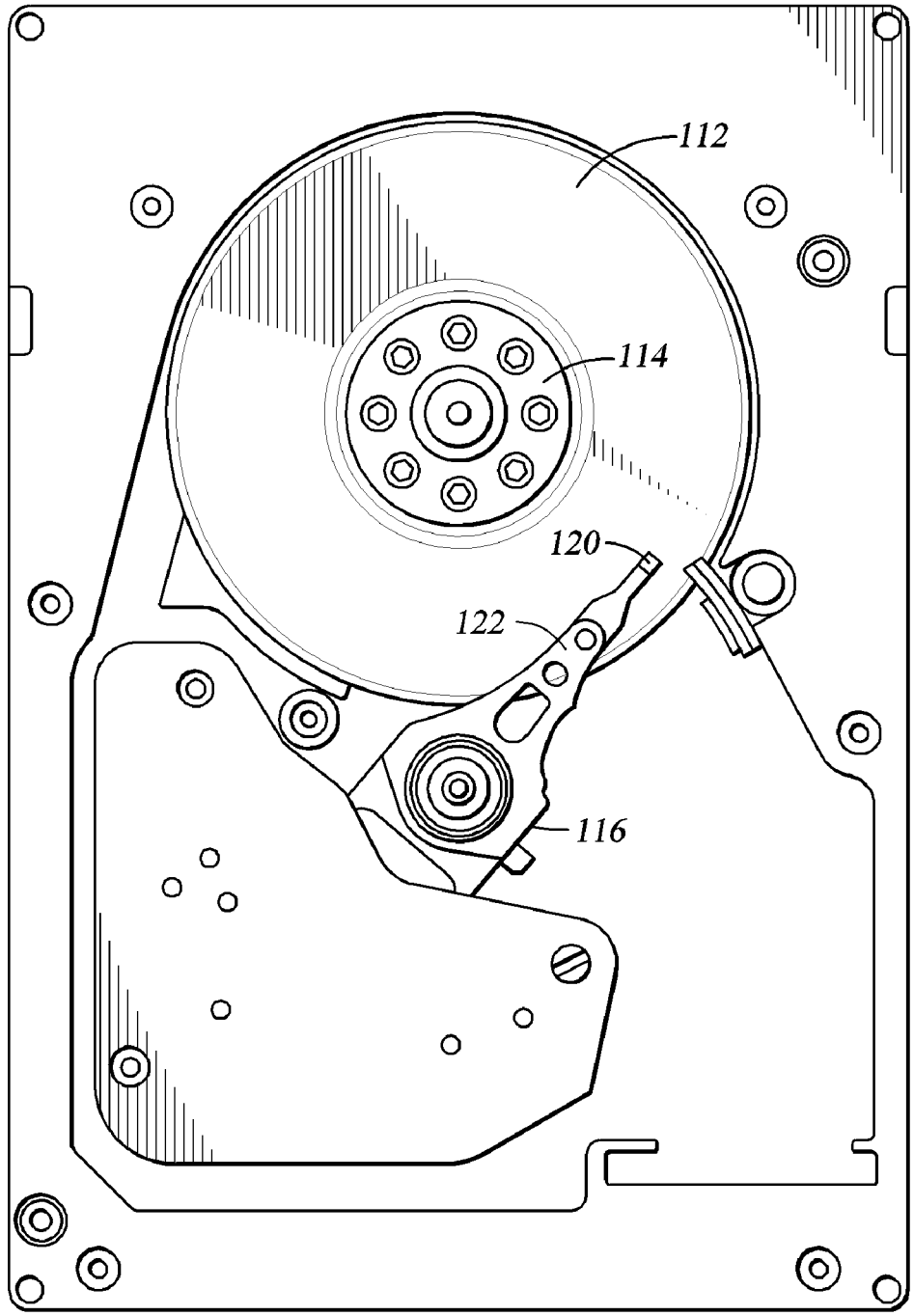
FIG. 1 is a block diagram depicting a hard drive according to one embodiment of the invention.

FIG. 1 is a block diagram depicting a hard drive 100 according to one embodiment of the invention. The hard disk drive 100 includes a magnetic media hard disk 112 mounted upon a motorized spindle 114. An actuator arm 116 is pivotally mounted within the hard disk drive 100 with a slider 120 disposed upon a distal end 122 of the actuator arm 116. During operation of the hard disk drive 100, the hard disk 112 rotates upon the spindle 114 and the slider 120 acts as an air-bearing surface (ABS) adapted for flying above the surface of the disk 112. The slider 120 includes a substrate base upon which various layers and structures that form a magnetoresistive sensor, described in greater detail below, are fabricated.

Layers of a Tunneling Magnetoresistive (TMR) Sensor

Figure 2:
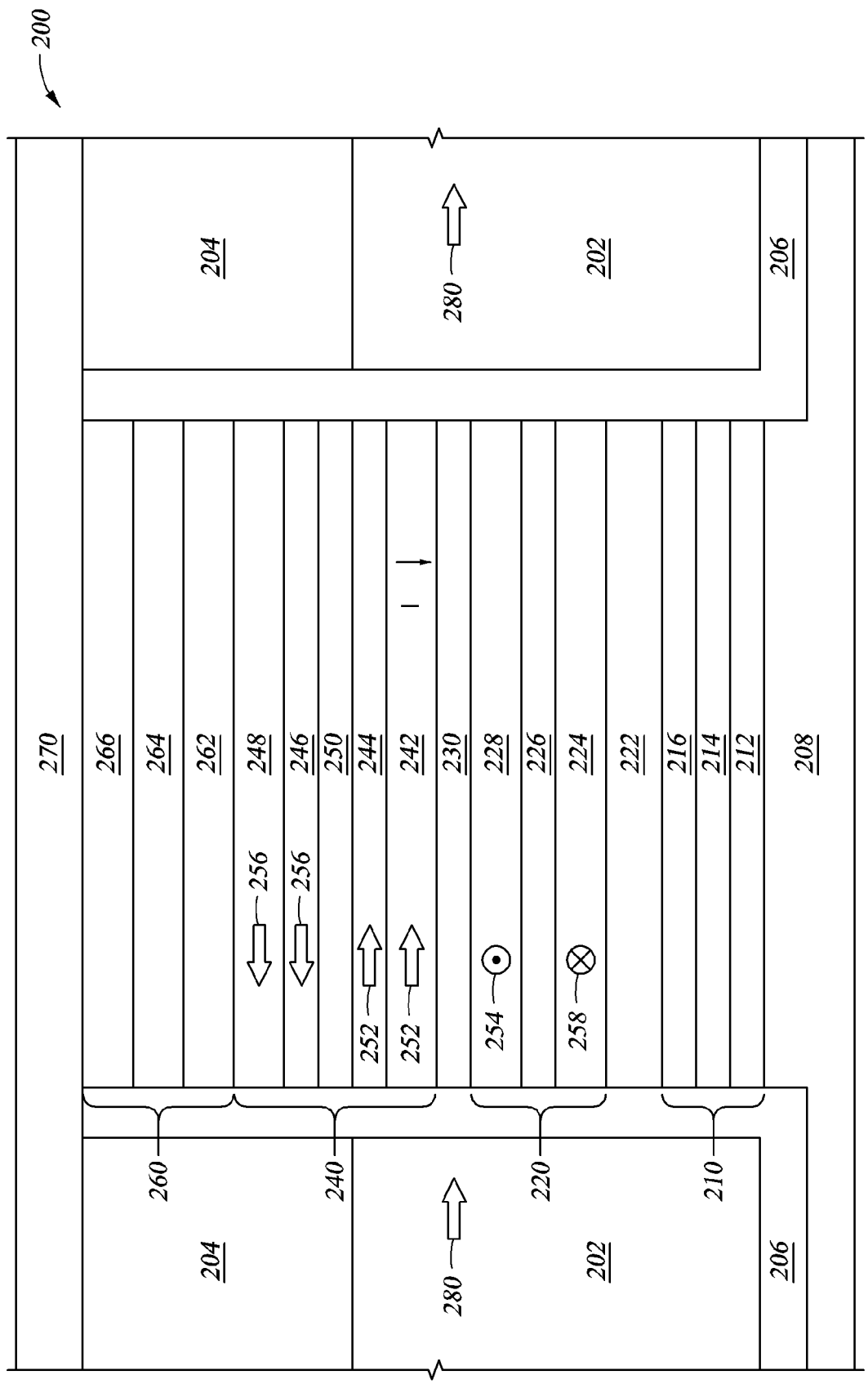
FIG. 2 is a block diagram depicting a tunneling magnetoresistive (TMR) sensor with an anti-parallel (AP) free layer according to one embodiment of the invention.

FIG. 2 is a block diagram depicting exemplary layers of a typical current-perpendicular-to-plane tunneling magnetoresistive (CPP TMR) sensor 200 according to one embodiment of the invention. The sensor 200 may be included, for example, as part of the hard disk drive 100 depicted in FIG. 1. As depicted, the sensor 200 may include a bottom shield 208, one or more seed layers 210, a pinning layer 222, one or more pinned layers 220, a barrier layer 230, one or more free layers 240, one or more cap layers 260, and a top shield layer 270. The layers of the sensor 200 may be partially or fully enclosed by insulating layers 206 to prevent shorting between the layers. The insulating layers 206 may, for example, be formed from aluminum-oxide and may be 80 angstroms (A) thick. Hard bias layers 202 may also be provided adjacent to the layers of the sensor 200 to provide magnetic stabilization to the layers of the sensor 200 via a biasing field 280. In one embodiment, the direction of the biasing field 280 may be selected to provide optimum sensitivity and stability of the sensor 200. The hard bias layers 202 may also be capped by hard bias capping layers 204 to protect the hard bias layers 202 during steps of the manufacturing process which are performed after the hard bias layers 202 have been deposited.

In one embodiment of the invention, the bottom shield layers 208 and the top shield layer 270 may provide magnetic shield for layers of the sensor 200. The top and bottom shield layers 208, 270 may, for example, be formed from nickel-iron (NiFe) and may be one micron thick. The seed layers 210 may be formed on the bottom shield layer 208 and may provide a base upon which other layers of the sensor 200 are deposited. The seed layers 210 may include, for example, a first seed layer 212 formed from tantalum (Ta), a second seed layer 214 formed from nickel-iron-chromium (NiFeCr), and a third seed layer 216 formed from NiFe. The first seed layer 212 may, for example, be 20 A thick, the second seed layer 214 may be 30 A thick, and the third seed layer 216 may be 8 A thick.

In one embodiment, the pinned layer 220 may be a simple single layer or an anti-parallel (AP) pinned layer. In the depicted embodiment, the pinned layer 220 is an AP pinned layer including two pinned layers (224 and 228) separated by a coupling layer 226. The pinned layers 220 may have magnetic moments 254, 258 which are pinned (fixed) in a given direction by the pinning layer 222 and which typically are not easily rotated by external magnetic fields. The magnetic moments 254, 258 of the pinned layers 220 may also be antiferromagnetically coupled with respect to each other. The pinning layer 222 may, for example, be formed from platinum-manganese (PtMn), iridium-manganese-chromium (IrMnCr), an iridium-manganese compound (IrMnX), or any other suitable material, and may be 60 A thick. The lower pinned layer 224 may be formed from cobalt-iron (CoFe) with 25 percent iron and may be 30 A thick. The upper pinned layer 228 may be formed from cobalt-iron-boron (CoFeB) and may be 30 A thick. The coupling layer 226 may be formed from ruthenium (Ru) and may be 5 A thick.

In one embodiment, the free layer 240 may be an AP free layer with antiparallel magnetic moments 252, 256 which are not pinned and can be rotated by external magnetic fields while being antiparallel coupled with respect to each other. As described below, the thicknesses of the upper and lower portions of the free layer 240 may be selected to improve magnetic stability of the free layer 240 while maintaining sensitivity of the free layer 240. The sensor 200 may also include one or more cap layers 260. The cap layers 260 may protect deposited layers of the sensor 200 during subsequent processing of the sensor 200. The cap layers 260 may include a first cap layer 262 which may be formed from Ru and may be 20 A thick, a second cap layer 264 which may be formed from Ta and may be 30 A thick, and a third cap layer 266 which may be formed from Ru and may be 20 A thick.

During operation, a current I may be applied to the sensor 200, for example, by applying a voltage across layers of the sensor 200. The current I may be used to measure a change in resistance of the sensor 200 during operation. In the depicted embodiment, the current I is perpendicular to the plane of the free layer 240. In one embodiment, the polarity of the applied voltage may be selected to provide optimum sensitivity and stability of the sensor 200. The current flow I tunneling through the barrier layer 230 may be affected by the respective alignments of the magnetic fields 252, 256 in the free layer 240 and the magnetic moment 254 in the upper portion of the pinned layer 228. In one embodiment, the barrier layer 230 may be a nonmagnetic layer of magnesium oxide (Mg—O), which may be, for example, 10 A thick. In other embodiments, the nonmagnetic barrier layer may comprise aluminum oxide (Al—O), titanium oxide (Ti—O), or any other suitable compound.

In one embodiment, the magnetic moments 252, 256 in the free layer 240 may be changed by magnetic fields representing data stored on a disk 112. When the magnetic moment 252 of the lower portion of the AP free layer 240 is parallel to the magnetic moment 254 of the upper pinned layer 228, the resistance of the sensor 200 may be decreased, and when the magnetic moment 252 of the lower portion of the AP free layer 240 is not parallel (e.g., anti-parallel) to the magnetic moment 254 of the upper portion of the pinned layer 254, the resistance of the read sensor 200 may be increased. As described above, the change in resistance of the sensor 200 (measured as a change in voltage across the sensor 200 resulting from the current I) may be used to read the pattern of magnetic transitions present on the magnetic disk 112. The sensitivity of the sensor 200 may be quantified by the Magnetoresistive (MR) Coefficient, the ratio of the change in the resistance of the sensor 200 between the decreased level (when the magnetic moments 252, 254 are parallel) and the increased level (when the magnetic moments 252, 254 are antiparallel), to the resistance of the sensor when the magnetic moments 252, 254 are parallel.

In the depicted embodiment, a bottom-spin valve type magnetoresistive sensor 200 is shown because the magnetoresistive sensor 200 has a pinned layer 220 which is located towards the bottom side of the magnetoresistive sensor 200, below the free layer 240. While described herein with respect to bottom-spin valve type TMR magnetoresistive sensor 200, embodiments of the invention may also be used with top-spin and dual-spin type TMR magnetoresistive sensors. Also, as described below, embodiments of the invention may also be utilized with current-perpendicular-to-plane (CPP) giant magnetoresistive (GMR) sensors, as described below.

In one embodiment of the invention, the free layer 240 may include a first free layer 242 and a second free layer 248 which have magnetic moments 252, 256 which are antiparallel coupled by the antiferromagnetic coupling layer 250. Also, first and second ferromagnetic coupling free layers 244, 246 may provide increased coupling between the first and second free layers 242, 248 and the antiferromagnetic coupling layer 250, respectively. Where the coupling between the first and second free layers 242, 248 and the antiferromagnetic coupling layer 250 is increased, the magnetic stability of the sensor 200 may be increased while maintaining sensitivity of the sensor 200. Also, as described below, the thickness of the first and second free layers 242, 248 may be selected to provide a large resistance swing for the sensor 200 while maintaining a low overall magnetic thickness of the free layer 240.

Figure 3:
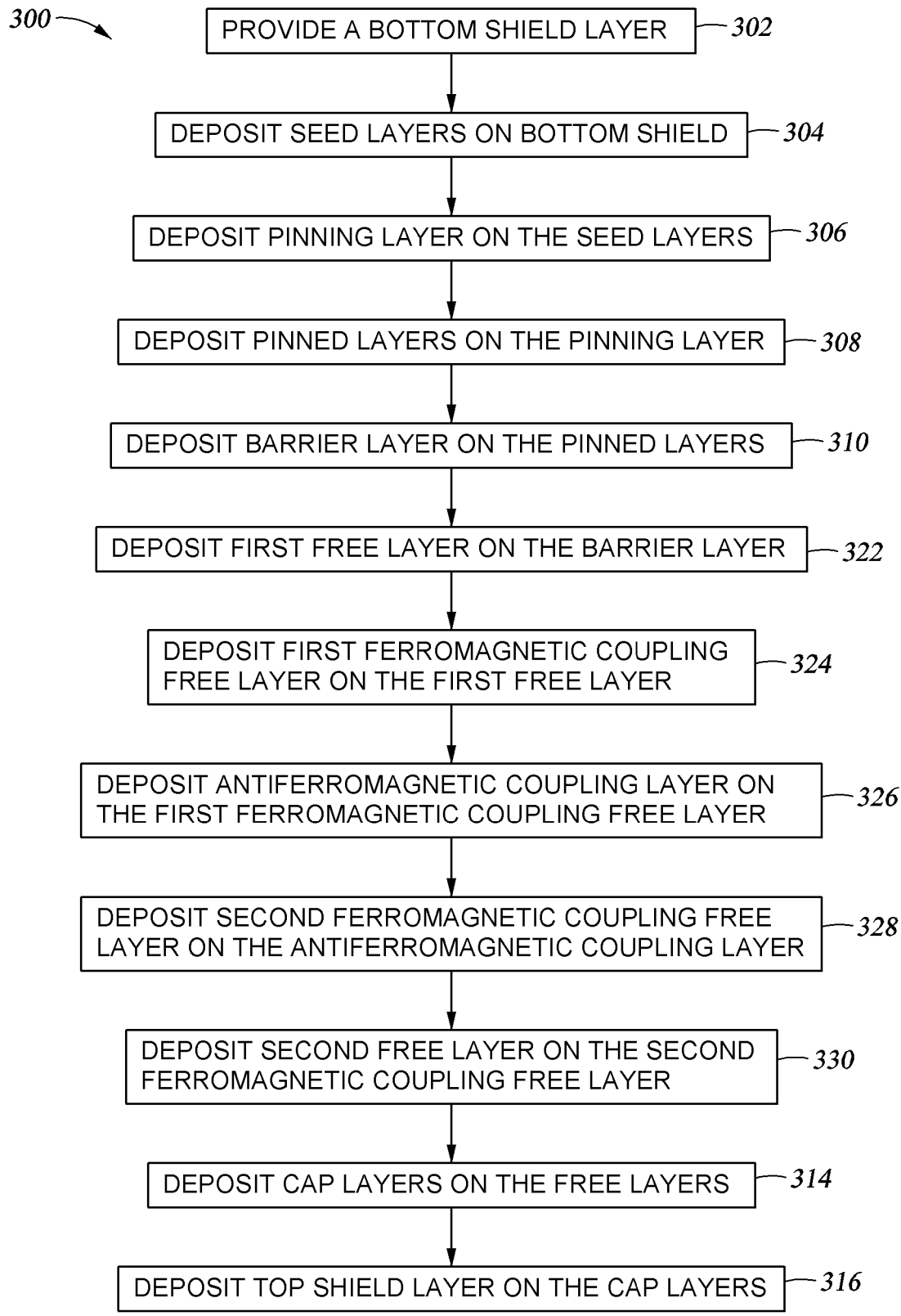
FIG. 3 is a flow diagram depicting a process for forming a TMR sensor with an AP free layer according to one embodiment of the invention.

FIG. 3 is a flow diagram depicting a process 300 for forming a TMR sensor 200 with an AP free layer 240 according to one embodiment of the invention. The process 300 may begin at step 302 where a bottom shield layer 208 is provided. The seed layers 210 may then be deposited on the bottom shield layer 208 at step 304. The pinning layer 222 may be deposited on the seed layers 210 at step 306 and the pinned layers 220 may be deposited on the pinning layer 222 at step 308. The barrier layer 230 may be deposited on the pinned layers 230 at step 310.

At step 322, a first free layer 242 may be deposited on the barrier layer 230. The first free layer 242 may be formed, for example, from cobalt-iron-boron (CoFeB). At step 324, a first ferromagnetic coupling free layer 244 may be deposited on the first free layer 242. As described above, the first ferromagnetic coupling free layer 244 may provide improved coupling between the first free layer 242 and the antiferromagnetic coupling layer 250 which may be deposited on the first ferromagnetic coupling free layer 244 at step 326. The first ferromagnetic coupling layer 244 may be formed, for example, from CoFe and may be 10 A thick. The antiferromagnetic coupling layer 250 may be formed from Ru and may be, for example, 5 A thick.

At step 328, a second ferromagnetic coupling free layer 246 may be deposited on the antiferromagnetic coupling layer 250. As described above, the second ferromagnetic coupling free layer 246 may also provide improved coupling between the antiferromagnetic coupling layer 250 and a second free layer 248 which may be deposited on the second ferromagnetic coupling free layer 246 at step 330. In one embodiment, the second ferromagnetic coupling free layer 246 may be formed from CoFe and may be 10 A thick. The second free layer 248 may be formed, for example, from CoFeB. At step 314, the cap layers 260 may be deposited on the free layers 240 (e.g., on the second free layer 248) and at step 316 the top shield layer 270 may be deposited on the cap layers 260.

In one embodiment of the invention, the thicknesses of layers within the AP free layer 240 may be selected to provide desired properties of the free layer 240. For example, in one embodiment of the invention, the thickness of the second free layer 248 may be selected to be greater than the thickness of the first free layer 242. Where the second free layer 248 is thicker than the first free layer 242, the magnetic stability of the sensor 200 may be increased.

In one embodiment of the invention, the thickness of the first free layer 242 may be selected to provide a full resistance swing for the sensor 200 (e.g., the thickness of the first free layer 242 may be selected to maximize the change in resistance of the sensor 200 during operation). For example, the thickness of the first free layer 242 may be greater than or equal to 60 A. After the thickness of the first free layer 242 has been selected, the thickness of the second free layer 248 may be selected to provide a desired net magnetic thickness of the free layer 240 to provide a desired magnetic stability for the sensor 200. For example, the second free layer 248 may be 20 A to 100 A thick.

While described above with respect to layers of specific thicknesses and compositions, it should be apparent to those of ordinary skill in the art that embodiments of the invention may be used with any ordering of layers, with layers of any composition, and with layers of any desired thickness. With respect to the process 300 for forming the sensor 200, the process 300 may also contain additional steps and may be performed in any manner as known to those skilled in the art.

Layers of a Giant Magnetoresistive (GMR) Sensor

Figure 4:
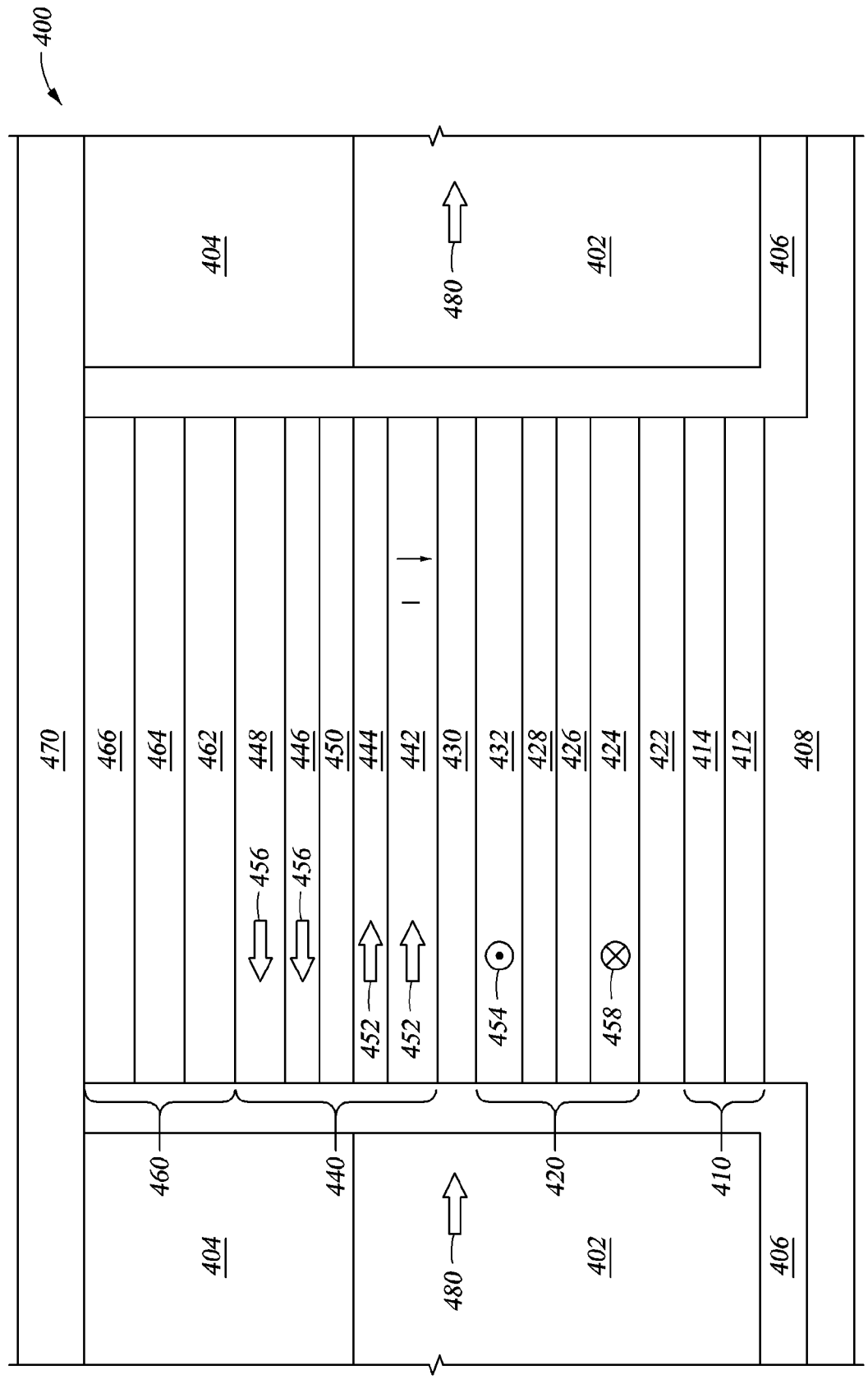
FIG. 4 is a block diagram depicting a giant magnetoresistive (GMR) sensor with an AP free layer according to one embodiment of the invention.

FIG. 4 is a block diagram depicting a giant magnetoresistive (GMR) sensor 400 with an AP free layer 440 according to one embodiment of the invention. The sensor 400 may be included, for example, as part of the hard disk drive 100 depicted in FIG. 1. As depicted, the sensor 400 may include a bottom shield 408, one or more seed layers 410, a pinning layer 422, one or more pinned layers 420, a spacer layer 430, one or more free layers 440, one or more cap layers 460, and a top shield layer 470. The layers of the sensor 400 may be partially or fully enclosed by insulating layers 406 and the insulating layers 406 may, for example, be formed from aluminum-oxide and may be 80 A thick. Hard bias layers 402 may also be provided adjacent to the layers of the sensor 400 to provide a biasing field 480. In one embodiment, the direction of the biasing field 480 may be selected to provide optimum sensitivity and stability of the sensor 400. The hard bias layers 402 may also be capped by hard bias capping layers 404.

In one embodiment of the invention, the top and bottom shield layers 408, 470 may, for example, be formed from nickel-iron (NiFe) and may be one micron thick. The seed layers 410 may be formed on the bottom shield layer 408 and may provide a base upon which other layers of the sensor 400 are deposited. The seed layers 410 may include, for example, a first seed layer 412 formed from tantalum (Ta) and a second seed layer 414 formed from ruthenium (Ru). The first seed layer 412 may, for example, be 20 A thick and the second seed layer 414 may be 30 A thick.

In one embodiment, the pinned layer 420 may be a simple single layer or an anti-parallel (AP) pinned layer. In the depicted embodiment, the pinned layer 420 is an AP pinned layer including a first pinned layer 424 and a second and third pinned layer 428, 432 separated by a coupling layer 426. The pinned layers 420 may have magnetic moments 454, 458 which are pinned (fixed) in a given direction by the pinning layer 422 and which typically are not easily rotated by external magnetic fields. The magnetic moments 454, 458 of the pinned layers 420 may also be antiferromagnetically coupled with respect to each other. The pinning layer 422 may, for example, be formed from platinum-manganese (PtMn), iridium-manganese-chromium (IrMnCr), an iridium-manganese compound (IrMnX), or any other suitable material, and may be 60 A thick. The first pinned layer 424 may be formed from cobalt-iron (CoFe) with 25 percent iron and may be 30 A thick. The second pinned layer 428 may be formed from cobalt-iron-boron (CoFeB) with 50 percent iron and may be 5 A thick. The third pinned layer 432 may be formed from a Heusler compound (e.g., a half-metal). For example, the third pinned layer 432 may be formed from cobalt-manganese-germanium (CoMnGe) with 50 percent cobalt and may be 25 A thick. The coupling layer 426 may be formed from ruthenium (Ru) and may be 5 A thick.

In one embodiment, the free layer 440 may be an AP free layer with antiparallel magnetic moments 452, 456 which are not pinned and can be rotated by external magnetic fields while being antiparallel coupled with respect to each other. The thicknesses of the upper and lower portions of the free layer 440 may be selected to improve magnetic stability of the free layer 440 while maintaining sensitivity of the free layer 440. The sensor 400 may also include one or more cap layers 460. The cap layers 460 may include a first cap layer 462 which may be formed from Ru and may be 20 A thick, a second cap layer 464 which may be formed from Ta and may be 30 A thick, and a third cap layer 466 which may be formed from Ru and may be 20 A thick.

During operation, a current I may be applied to the sensor 400, for example, by applying a voltage across layers of the sensor 400. The current I may be used to measure a change in resistance of the sensor 400 during operation. In the depicted embodiment, the current I is perpendicular to the plane of the free layer 440. In one embodiment, the polarity of the applied voltage may be selected to provide optimum sensitivity and stability of the sensor 400. The current flow I through the spacer layer 430 may be affected by the respective alignments of the magnetic fields 452, 456 in the free layer 440 and the magnetic moment 454 in the upper portion of the pinned layer 428. In one embodiment, the spacer layer 430 may be formed from copper (Cu), which may be, for example, 30 A thick.

In one embodiment, the magnetic moments 452, 456 in the free layer 440 may be changed by magnetic fields representing data stored on a disk 112. When the magnetic moment 452 of the lower portion of the AP free layer 440 is parallel to the magnetic moment 454 of the upper pinned layer 428, the resistance of the sensor 400 may be decreased, and when the magnetic moment 452 of the lower portion of the AP free layer 440 is not parallel (e.g., anti-parallel) to the magnetic moment 454 of the upper portion of the pinned layer 454, the resistance of the read sensor 400 may be increased. As described above, the change in resistance of the sensor 400 (measured as a change in voltage across the sensor 400 resulting from the current I) may be used to read the pattern of magnetic transitions present on the magnetic disk 112.

In the depicted embodiment, a bottom-spin valve type magnetoresistive sensor 400 is shown because the magnetoresistive sensor 400 has a pinned layer 420 which is located towards the bottom side of the magnetoresistive sensor 400, below the free layer 440. While described herein with respect to bottom-spin valve type GMR magnetoresistive sensor 400, embodiments of the invention may also be used with top-spin and dual-spin type GMR magnetoresistive sensors.

In one embodiment of the invention, the free layer 440 may include a first free layer 442 and a second free layer 448 which have magnetic moments 452, 456 which are antiparallel coupled by the antiferromagnetic coupling layer 450. Also, first and second ferromagnetic coupling free layers 444, 446 may provide increased coupling between the first and second free layers 442, 448 and the antiferromagnetic coupling layer 450, respectively. Where the coupling between the first and second free layers 442, 448 and the antiferromagnetic coupling layer 450 is increased, the magnetic stability of the sensor 400 may be increased while maintaining sensitivity of the sensor 400. Also, as described below, the thickness of the first and second free layers 442, 448 may be selected to provide a large resistance swing for the sensor 400 while maintaining a low overall magnetic thickness of the free layer 440.

Figure 5:
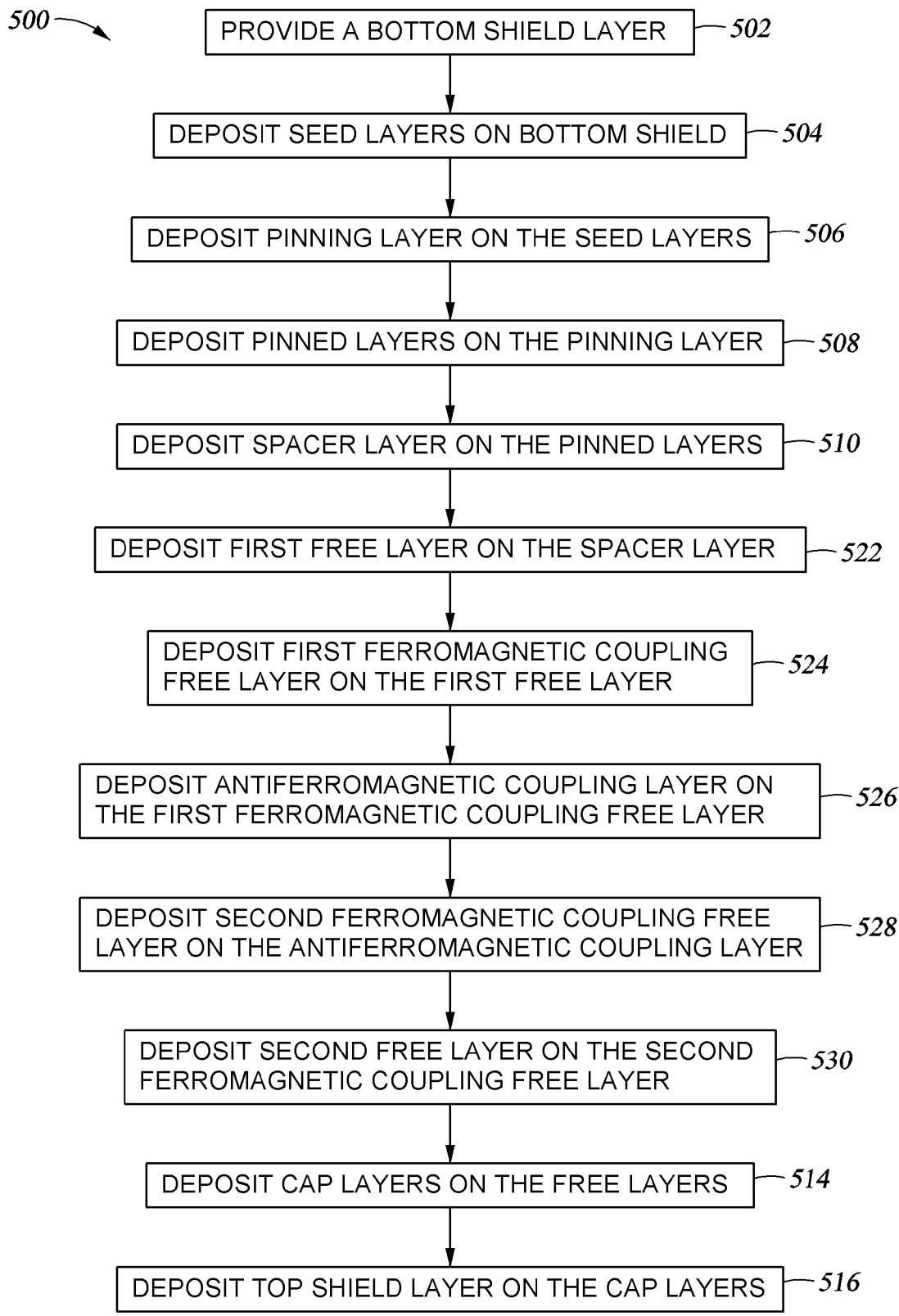
FIG. 5 is a flow diagram depicting a process for forming a GMR sensor with an AP free layer according to one embodiment of the invention.

FIG. 5 is a flow diagram depicting a process 500 for forming a GMR sensor 400 with an AP free layer 440 according to one embodiment of the invention. The process 500 may begin at step 502 where a bottom shield layer 408 is provided. The seed layers 410 may then be deposited on the bottom shield layer 408 at step 504. The pinning layer 422 may be deposited on the seed layers 410 at step 506 and the pinned layers 420 may be deposited on the pinning layer 422 at step 508. The spacer layer 430 may be deposited on the pinned layers 430 at step 510.

At step 522, a first free layer 442 may be deposited on the spacer layer 430. The first free layer 442 may be formed, for example, from a Heusler compound such as CoMnGe with 50 percent cobalt. At step 524, a first ferromagnetic coupling free layer 444 may be deposited on the first free layer 442. As described above, the first ferromagnetic coupling free layer 444 may provide improved coupling between the first free layer 442 and the antiferromagnetic coupling layer 450 which may be deposited on the first ferromagnetic coupling free layer 444 at step 526. The first ferromagnetic coupling layer 444 may be formed, for example, from CoFe and may be 5 A thick. The antiferromagnetic coupling layer 450 may be formed from Ru and may be, for example, 5 A thick.

At step 528, a second ferromagnetic coupling free layer 446 may be deposited on the antiferromagnetic coupling layer 450. As described above, the second ferromagnetic coupling free layer 446 may also provide improved coupling between the antiferromagnetic coupling layer 450 and a second free layer 448 which may be deposited on the second ferromagnetic coupling free layer 446 at step 530. In one embodiment, the second ferromagnetic coupling free layer 446 may be formed from CoFe and may be 5 A thick. The second free layer 448 may be formed, for example, from nickel-iron (NiFe). At step 514, the cap layers 460 may be deposited on the free layers 440 (e.g., on the second free layer 448) and at step 516 the top shield layer 470 may be deposited on the cap layers 460.

In one embodiment of the invention, the thicknesses of layers within the AP free layer 440 may be selected to provide desired properties of the free layer 440. For example, in one embodiment of the invention, the thickness of the second free layer 448 may be selected to be greater than the thickness of the first free layer 442. Where the second free layer 448 is thicker than the first free layer 442, the magnetic stability of the sensor 400 may be increased.

In one embodiment of the invention, the thickness of the first free layer 442 may be selected to provide a full resistance swing for the sensor 400 (e.g., the thickness of the first free layer 442 may be selected to maximize the change in resistance of the sensor 400 during operation). For example, the thickness of the first free layer 442 may be greater than or equal to 60 A. After the thickness of the first free layer 442 has been selected, the thickness of the second free layer 448 may be selected to provide a desired net magnetic thickness of the free layer 440 to provide a desired magnetic stability for the sensor 400. For example, the second free layer 448 may be 20 A to 100 A thick.

While described above with respect to layers of specific thicknesses and compositions, it should be apparent to those of ordinary skill in the art that embodiments of the invention may be used with any ordering of layers, with layers of any composition, and with layers of any desired thickness. With respect to the process 500 for forming the sensor 400, the process 500 may also contain additional steps and may be performed in any manner as known to those skilled in the art.

While the foregoing is directed to embodiments of the present invention, other and further embodiments of the invention may be devised without departing from the basic scope thereof, and the scope thereof is determined by the claims that follow.

What is claimed is:

1. A method for forming a magnetoresistive sensor, comprising:
providing a first layer; and
providing an antiparallel free layer formed on the first layer, wherein providing the antiparallel free layer comprises:
providing a first free layer formed on the first layer;
providing a first ferromagnetic coupling free layer formed on the first free layer, wherein the first ferromagnetic coupling layer is configured to provide increased coupling between the first free layer and an antiferromagnetic coupling layer;
providing the antiferromagnetic coupling layer formed on the first ferromagnetic coupling free layer;
providing a second ferromagnetic coupling free layer formed on the antiferromagnetic coupling layer; and
providing a second free layer formed on the second ferromagnetic coupling free layer, wherein the second ferromagnetic coupling layer is configured to provide increased coupling between the second free layer and the antiferromagnetic coupling layer and a thickness of the second free layer is greater than a thickness of the first free layer.

2. The method of claim 1, wherein the magnetoresistive sensor is a tunneling magnetoresistive sensor, and wherein the first layer is a barrier layer.

3. The method of claim 2, wherein the magnetoresistive sensor is a current perpendicular-to-plane magnetoresistive sensor.

4. The method of claim 1, wherein the magnetoresistive sensor is a giant magnetoresistive sensor, and wherein the first layer is a spacer layer.

5. The method of claim 4, wherein the magnetoresistive sensor is a current perpendicular-to-plane magnetoresistive sensor.

6. The method of claim 1, the first and second free layers are formed from cobalt-iron-boron, and wherein the first and second coupling free layers are formed from cobalt-iron.

7. The method of claim 1, the first free layer is formed from a Heusler compound, wherein the second free layer is formed from nickel-iron, and wherein the first and second coupling free layers are formed from cobalt-iron.

8. The method of claim 1, wherein the antiferromagnetic coupling layer is formed from ruthenium.

9. The method of claim 1, wherein the first free layer is at least sixty angstroms thick.

10. The method of claim 1, wherein a thickness of the second free layer is greater than or equal to twenty angstroms and less than or equal to one hundred angstroms.

11. A magnetoresistive sensor, comprising:
a first layer; and
an antiparallel free layer disposed on the first layer, comprising:
a first free layer disposed on the first layer;
a first ferromagnetic coupling free layer disposed on the first free layer, wherein the first ferromagnetic coupling layer is configured to provide increased coupling between the first free layer and an antiferromagnetic coupling layer;
the antiferromagnetic coupling layer disposed on the first ferromagnetic coupling free layer;
a second ferromagnetic coupling free layer disposed on the antiferromagnetic coupling layer; and
a second free layer disposed on the second ferromagnetic coupling free layer, wherein the second ferromagnetic coupling layer is configured to provide increased coupling between the second free layer and the antiferromagnetic coupling layer and a thickness of the second free layer is greater than a thickness of the first free layer.

12. The magnetoresistive sensor of claim 11, wherein the magnetoresistive sensor is a tunneling magnetoresistive sensor, and wherein the first layer is a barrier layer.

13. The magnetoresistive sensor of claim 12, wherein the magnetoresistive sensor is a current perpendicular-to-plane magnetoresistive sensor.

14. The magnetoresistive sensor of claim 11, wherein the magnetoresistive sensor is a giant magnetoresistive sensor, and wherein the first layer is a spacer layer.

15. The magnetoresistive sensor of claim 14, wherein the magnetoresistive sensor is a current perpendicular-to-plane magnetoresistive sensor.

16. The magnetoresistive sensor of claim 11, the first and second free layers are formed from cobalt-iron-boron, and wherein the first and second coupling free layers are formed from cobalt-iron.

17. The magnetoresistive sensor of claim 11, the first free layer is formed from a Heusler compound, wherein the second free layer is formed from nickel-iron, and wherein the first and second coupling free layers are formed from cobalt-iron.

18. The magnetoresistive sensor of claim 11, wherein the antiferromagnetic coupling layer is formed from ruthenium.

19. The magnetoresistive sensor of claim 11, wherein the first free layer is at least sixty angstroms thick.

20. The magnetoresistive sensor of claim 11, wherein a thickness of the second free layer is greater than or equal to twenty angstroms and less than or equal to one hundred angstroms.

21. A hard drive comprising:
one or more magnetic disks; and at least one magnetoresistive sensor configured to read data from the one or magnetic disks, wherein the magnetoresistive sensor comprises:
a first layer; and
an antiparallel free layer disposed on the first layer, comprising:
  a first free layer disposed on the first layer;
  a first ferromagnetic coupling free layer disposed on the first free layer, wherein the first ferromagnetic coupling layer is configured to provide increased coupling between the first free layer and an antiferromagnetic coupling layer;
  the antiferromagnetic coupling layer disposed on the first ferromagnetic coupling free layer;
  a second ferromagnetic coupling free layer disposed on the antiferromagnetic coupling layer; and
  a second free layer disposed on the second ferromagnetic coupling free layer, wherein the second ferromagnetic coupling layer is configured to provide increased coupling between the second free layer and the antiferromagnetic coupling layer and a thickness of the second free layer is greater than a thickness of the first free layer.

22. The hard drive of claim 21, wherein the magnetoresistive sensor is a tunneling magnetoresistive sensor, and wherein the first layer is a barrier layer.

23. The hard drive of claim 22, wherein the magnetoresistive sensor is a current perpendicular-to-plane magnetoresistive sensor.

24. The hard drive of claim 21, wherein the magnetoresistive sensor is a giant magnetoresistive sensor, and wherein the first layer is a spacer layer.

25. The hard drive of claim 24, wherein the magnetoresistive sensor is a current perpendicular-to-plane magnetoresistive sensor.

26. The hard drive of claim 21, the first and second free layers are formed from cobalt-iron-boron, and wherein the first and second coupling free layers are formed from cobalt-iron.

27. The hard drive of claim 21, the first free layer is formed from a Heusler compound, wherein the second free layer is formed from nickel-iron, and wherein the first and second coupling free layers are formed from cobalt-iron.

28. The hard drive of claim 21, wherein the antiferromagnetic coupling layer is formed from ruthenium.

29. The hard drive of claim 21, wherein the first free layer is at least sixty angstroms thick.

30. The hard drive of claim 21, wherein a thickness of the second free layer is greater than or equal to twenty angstroms and less than or equal to one hundred angstroms.

* * * * *